United States Patent
Sugahara

(10) Patent No.: US 7,358,643 B2
(45) Date of Patent: Apr. 15, 2008

(54) PIEZOELECTRIC ACTUATOR, METHOD FOR MANUFACTURING PIEZOELECTRIC ACTUATOR, AND LIQUID TRANSPORTING APPARATUS

(75) Inventor: Hiroto Sugahara, Aichi-ken (JP)

(73) Assignee: Brother Kogyo Kabushiki Kaisha, Nagoya-shi (JP)

(*) Notice: Subject to any disclaimer, the term of this patent is extended or adjusted under 35 U.S.C. 154(b) by 137 days.

(21) Appl. No.: 11/273,062

(22) Filed: Nov. 14, 2005

(65) Prior Publication Data
US 2006/0103268 A1    May 18, 2006

(30) Foreign Application Priority Data
Nov. 12, 2004    (JP)    ............... 2004-329265

(51) Int. Cl.
*B41J 2/045* (2006.01)
(52) U.S. Cl. ............ 310/311; 310/363; 310/365; 310/347
(58) Field of Classification Search ............. 310/311, 310/348, 363, 364, 365, 347; 341/70, 71
See application file for complete search history.

(56) References Cited

U.S. PATENT DOCUMENTS

| 6,157,084 | A | 12/2000 | Hino et al. | |
| 6,347,441 | B1* | 2/2002 | Yun et al. | 29/25.35 |
| 6,969,157 | B2* | 11/2005 | Tomozawa et al. | 347/68 |
| 2002/0093078 | A1* | 7/2002 | Paek | 257/676 |
| 2003/0112298 | A1* | 6/2003 | Sato et al. | 347/68 |
| 2003/0121698 | A1* | 7/2003 | Kyougoku et al. | 174/261 |
| 2004/0104977 | A1 | 6/2004 | Mitsuhashi et al. | |

FOREIGN PATENT DOCUMENTS

| JP | 2003-69103 | 3/2003 |
| JP | 2003-162515 | 6/2003 |

* cited by examiner

*Primary Examiner*—Darren Schuberg
*Assistant Examiner*—Bryan P Gordon
(74) *Attorney, Agent, or Firm*—Reed Smith LLP

(57) ABSTRACT

A piezoelectric actuator includes a supporting member in which pressure chambers are formed, a vibration plate which is joined to a joining section of the supporting member, a piezoelectric layer formed on the vibration plate, and an FPC provided on the piezoelectric layer. A contact section of an electrode formed on the piezoelectric layer and a terminal section of the FPC are electrically connected via a bump formed on the terminal section. A recess is formed on an upper surface of the supporting member right below the bump. While joining the piezoelectric layer and a wire member, any damage of the piezoelectric layer and any poor connection do not occur.

19 Claims, 15 Drawing Sheets

PIEZOELECTRIC ACTUATOR, METHOD FOR MANUFACTURING PIEZOELECTRIC ACTUATOR, AND LIQUID TRANSPORTING APPARATUS

BACKGROUND OF THE INVENTION

1. Field of the Invention

The present invention relates to a piezoelectric actuator, a method for manufacturing piezoelectric actuator, and a liquid transporting apparatus which includes the piezoelectric actuator.

2. Description of the Related Art

A piezoelectric actuator which drives an object by using a deformation developed in a piezoelectric layer when an electric field is made to act in the piezoelectric actuator has been hitherto used widely in various fields. For example, an ink-jet head, which discharges ink when a pressure is applied to the ink in a pressure chamber by the piezoelectric actuator, is described in U.S. Patent Application Publication No. US 2003/112298 A1 (corresponding to Japanese Patent Application Laid-open No. 2003-69103). This ink-jet head includes a metallic substrate, a plurality of piezoelectric elements (piezoelectric layer) arranged in the form of a matrix on the substrate, a piezoelectric actuator which has common electrodes and signal electrodes (individual electrodes) formed on an upper surface and a lower surface of the piezoelectric elements respectively, and a flexible printed circuit board (FCC) made of a resin base material.

A plurality of terminal sections is formed on the FCC on a surface facing the piezoelectric elements, and these terminal sections correspond to the signal electrodes on the upper surface of the piezoelectric elements. Each of the terminal sections has a hemispherical bump which includes a core material and a joining material. After positioning the signal electrodes and the bumps, the signal electrodes on the upper surface of the piezoelectric layer and the terminal sections of the FCC are electrically connected through the bumps by heating and pressurizing the FCC, or by applying vibration to the FCC from the surface of the FCC on the side opposite to the piezoelectric layer.

However, while joining the signal electrodes on the upper surface of the piezoelectric elements and the terminal sections of the FCC, stress acts locally in an area of each of the piezoelectric elements facing the bumps. Therefore, there is a possibility that the piezoelectric layer is damaged in the area. Moreover, in many cases, height of the bumps formed on the FCC is uneven. In this case, due to the uneven height, while connecting the electrodes on the upper surface of the piezoelectric layer and the terminal sections of the FCC, there is a portion where the electrodes on the upper surface of the piezoelectric layer and the bumps provided to the terminal sections of the FCC do not sufficiently contact with each other. Accordingly, there is a possibility of a poor connection between the electrodes on the upper surface of the piezoelectric layer and the terminals of the FCC.

SUMMARY OF THE INVENTION

An object of the present invention is to prevent the damage of a piezoelectric layer by alleviating the concentrated action of the stress locally on the piezoelectric layer while joining the electrodes on the upper surface of the piezoelectric layer and the terminal sections of a wire member such as an FCC, and to prevent the poor connection between the electrodes on the upper surface of the piezoelectric layer and the terminal section of the wire member due to the uneven height of the bumps.

The present invention employs the following structures associated with FIG. 1 to FIG. 15 shown in embodiments. However, reference numerals in brackets for elements are only for exemplification and each of the elements is not restricted by the reference numeral assigned thereto.

According to a first aspect of the present invention, there is provided a piezoelectric actuator which includes a vibration plate (60, 74); a supporting member (40) having a relieving section (pressure chamber) which relieves a deformation of the vibration plate (60, 74), and a joining section (40a) joined to the vibration plate; a first electrode (60, 112) arranged on a surface of the vibration plate on a side opposite to the supporting member (40); a piezoelectric layer (61) which is arranged on a surface of the first electrode on a side opposite to the vibration plate; a second electrode (62) arranged on a surface of the piezoelectric layer on a side opposite to the vibration plate, in an area facing the relieving section; a contact section (62a) formed on the surface of the piezoelectric layer on the side opposite to the vibration plate, in an area facing the joining section, the contact section being connected to the second electrode; and a wire member (65) which supplies a drive voltage to the contact section (62a). In the piezoelectric actuator, an electroconductive bump (65a) is formed on one of a terminal section of the wire member and the contact section, the bump being projected toward the other of the terminal section and the contact section to electrically connect the contact section and the terminal section; and a reduced-stiffness section (60a, 70a, 71a, 73, 75, 76, 78, and 79a) is provided between the vibration plate and the supporting member, or between the vibration plate and the piezoelectric layer, at a portion facing the bump, the reduced-stiffness section having a stiffness reduced than a stiffness of a portion other than the portion facing the bump.

Accordingly, the concentration of the stress acting on the piezoelectric layer while joining the piezoelectric layer and the wire member is alleviated or relieved by the reduced-stiffness section, and the damage of the piezoelectric layer can be prevented. Moreover, since the stiffness is reduced in the area facing the bump, between the vibration plate and the supporting member or between the vibration plate and the piezoelectric layer, the bump and the contact section or the terminal section are adhered more tightly, and the poor connection between the contact section of the second electrode and the terminal section of the wire member due to the uneven height among the bumps can be prevented. In the present patent application, the term "a portion facing the bump" means a portion (area) which includes a position (a position in a direction of a plane of the vibration plate) right below the bump. Accordingly, a case in which no reduced-stiffness section is provided at the position right below the bump does not mean that "a reduced-stiffness section is provided at a portion facing the bump".

Moreover, the reduced-stiffness section of the piezoelectric actuator according to the present invention may be interposed between the vibration plate and the supporting member, and may be a low-elasticity material having a lower elasticity (a lower coefficient of elasticity) than an elasticity of the vibration plate and an elasticity of the supporting member. Accordingly, the concentration of the stress acting on the piezoelectric layer while joining the piezoelectric layer and the wire member, can be relieved by the reduced-stiffness section, thereby preventing the damage of the piezoelectric layer. In addition, the poor connection between the contact section of the individual electrode and the terminal section of the wire member due to the uneven height of the bumps can be prevented.

Moreover, the reduced-stiffness section of the piezoelectric actuator of the present invention may be a through hole or a recess formed in at least one of the vibration plate and the supporting member, at a portion facing the bump, the recess or the through hole being open toward the other of the vibration plate and the supporting member. Accordingly, the concentration of the stress acting on the piezoelectric layer while joining the piezoelectric layer and the wire member can be relieved by the aid of the recess or the hole, thereby preventing the damage of the piezoelectric layer. In addition, the poor connection between the contact section of the individual electrode and the terminal section of the wire member due to the uneven height of the bumps can be prevented.

In this case, a low-elasticity material having a lower elasticity than an elasticity of the vibration plate and an elasticity of the supporting member may be filled in the recess or the hole formed in the vibration plate or the supporting member. Accordingly, the concentration of the stress acting on the piezoelectric layer while joining the piezoelectric layer and the wire member is relieved by the low-elasticity material filled in the recess or the hole, thereby preventing the damage of the piezoelectric layer. In addition, the poor connection between the contact section of the individual electrode and the terminal section of the wire member due to the uneven height of the bumps can be prevented.

Moreover, the supporting member of the piezoelectric actuator of the present invention may be formed of a metallic material. Accordingly, the relieving section can be formed easily by a method such as etching. Moreover, when the recess or the hole is formed as the reduced-stiffness section, the recess or the hole can be formed easily. Or, the supporting member may be formed by an insulating material or an adhesive.

Furthermore, it is desirable that the vibration plate of the piezoelectric actuator of the present invention is made of a metallic material and that the vibration plate serves as the first electrode. Accordingly, a process for separately forming the first electrode is not required and the manufacturing process can be simplified.

Moreover, in the piezoelectric actuator of the present invention, an insulating layer may be interposed between the vibration plate and the piezoelectric layer, and at the portion facing the bump. Accordingly, in the area where the bump is formed, an electrostatic capacitance developed in the piezoelectric layer which is sandwiched between the contact section of the second electrode and the first electrode can be reduced to be smaller and a drive efficiency of the actuator can be improved.

In this case, it is desirable that the insulating layer is formed of a material which has a lower elasticity than an elasticity of the vibration plate and an elasticity of the piezoelectric layer. Accordingly, the concentration of the stress acting on the piezoelectric layer while joining the contact section and the wire member is relieved by the insulating layer, thereby preventing the damage to the piezoelectric layer. In addition, the poor connection between the contact section of the individual electrode and the terminal section of the FCC due to the uneven height of the bumps can be prevented.

If a pressing weight of the bump is taken into consideration, a length of the reduced-stiffness section in a direction of a plane of the piezoelectric layer may be not less than four times of a sum of a thickness of the vibration plate and a thickness of the piezoelectric layer, and particularly about six times or not less than six times of the sum of the thickness of the vibration plate and the thickness of the piezoelectric layer.

According to the present invention, there is also provided a liquid transporting apparatus which includes a liquid channel having a nozzle, a pressure chamber communicating with the nozzle, and the piezoelectric actuator of the present invention, wherein the relieving section of the supporting member of the piezoelectric actuator corresponds to the pressure chamber.

According to a second aspect of the present invention, there is provided a method for manufacturing a piezoelectric actuator, the method including; a first step of providing a reduced-stiffness section between the vibration plate and the supporting member, and at a portion facing a portion in which the bump is to be arranged, the reduced-stiffness section having a stiffness reduced than a stiffness of a portion other than the portion facing the bump; a second step of joining the vibration plate and the supporting member at the joining section; a third step of forming the piezoelectric layer on the surface of the vibration plate on the side opposite to the supporting member, the first electrode being arranged on the surface; a fourth step of forming, on the surface of the piezoelectric layer on the side opposite to the vibration plate, the second electrode in an area facing the relieving section, and a contact section connected to the second electrode in an area facing the joining section; a fifth step of forming the bump having electroconductivity on one of the terminal section of the wire member and the contact section, the bump projecting toward the other of the terminal section and the contact section; and a sixth step of pressing the wire member against the contact section to electrically connect the terminal section of the wire member and the contact section via the bump.

Accordingly, when the wire member is pressed against the contact section, the concentration of the stress acting on the piezoelectric layer is relieved by the reduced-stiffness section, and the damage of the piezoelectric layer can be prevented. Moreover, the poor connection between the contact section and the terminal section of the wire member due to the uneven height of the bumps can be prevented. Accordingly, it is possible to manufacture a highly reliable piezoelectric actuator.

In this case, in the first step, it is desired that a recess or a through hole is formed as the reduced-stiffness section, in at least one of the vibration plate and the supporting member, at a portion facing the portion where the bump is to be arranged, the recess or the hole being open toward the other of the vibration plate and the supporting member. Accordingly, the concentration of the stress acting on the piezoelectric layer can be relieved by the section having the stiffness reduced by being provided with the recess or the hole. In addition, the poor connection between the contact section and the terminal section of the wire member can be prevented. Accordingly, it is possible to manufacture a highly reliable piezoelectric actuator.

In this case, in the third step, the piezoelectric layer may be formed by an aerosol deposition method or a sputtering method. Accordingly, a thin piezoelectric layer can be formed easily.

According to a third aspect of the present invention, there is provided a liquid transporting apparatus which includes a liquid channel (31) including a plurality of pressure chambers (44) arranged along a plane and communicating with nozzles respectively, and a piezoelectric actuator (32) which changes a volume of the pressure chambers to apply pressure to the liquid in the pressure chambers, wherein the piezoelectric actuator includes; a pressure chamber plate (40) in which the pressure chambers are formed; a vibration plate (60) which is joined to one surface of the pressure chamber plate and which covers the plurality of pressure chambers; a common electrode (60, 112) which is arranged on a surface of the vibration plate (60) on a side opposite to the pressure chambers; a piezoelectric layer (61) formed on a surface of the common electrode on a side opposite to the vibration plate; a plurality of individual electrodes (62) which are arranged on a surface of the piezoelectric layer on a side opposite to the vibration plate, in an area facing the pressure chambers respectively; a plurality of contact sections (62a) which are formed on the surface of the piezoelectric layer on the side opposite to the vibration plate, in an area where the vibration chamber plate and the vibration plate are joined, the contact sections being connected to the individual electrodes respectively; and a wire member (65) which selectively supplies a drive voltage to the contact sections. In the liquid transporting apparatus, a plurality of electroconductive bumps are formed on one of the wire member and the respective contact sections, the bumps being projected toward the other of the wire member and the contact sections to electrically connect the wire member and the contact sections; and a plurality of reduced-stiffness sections (60a, 70a, 71a, 73, 75, 76, 78, and 79a) are formed on at least one of the vibration plate and the pressure chamber plate, at a portion facing the bumps, each of the reduced-stiffness sections having a stiffness reduced than a stiffness of a portion other than the portion facing the bumps.

Accordingly, when the wire member is pressed against the contact sections, the concentration of the stress acting on the piezoelectric layer is relieved by the reduced-stiffness sections, and the damage of the piezoelectric layer can be prevented. Also, the poor connection between the individual electrodes and the wire member due to the uneven height of the bumps can be prevented. Therefore, the reliability of the liquid transporting apparatus is improved.

In this case, each of the reduced-stiffness sections may be a recess or a through hole formed in at least one of the vibration plate and the pressure chamber plate, at a portion facing one of the bumps, the recess or the through hole being open toward the other of the vibration plate and the pressure chamber plate. Accordingly, the concentration of the stress acting on the piezoelectric layer when the wire member is pressed against the contact section, is relieved by the recess or the through hole formed in at least one of the vibration plate and the pressure chamber plate, thereby preventing the damage of the piezoelectric layer. In addition, the poor connection between the individual electrodes and the wire member due to the uneven height of the bumps can be prevented. Therefore, the reliability of the liquid transporting apparatus is improved.

Furthermore, in this case, it is desirable that the recess or the hole is extended at least up to a space between a pressure chamber of the pressure chambers and an adjacent pressure chamber to the pressure chamber. Accordingly, a phenomenon (so called cross-talk), in which the deformation of the piezoelectric layer in an area facing a certain pressure chamber is propagated to another pressure chamber, can be suppressed by the recess. The liquid transporting apparatus of the present invention may be applicable to an ink-jet printer.

DETAILED DESCRIPTION OF THE PREFERRED EMBODIMENTS

A preferred embodiment of the present invention will be described below with reference to the accompanying drawings. The embodiment is an example in which the present invention is applied to a piezoelectric actuator used in an ink-jet head of an ink-jet printer.

Figure 1:
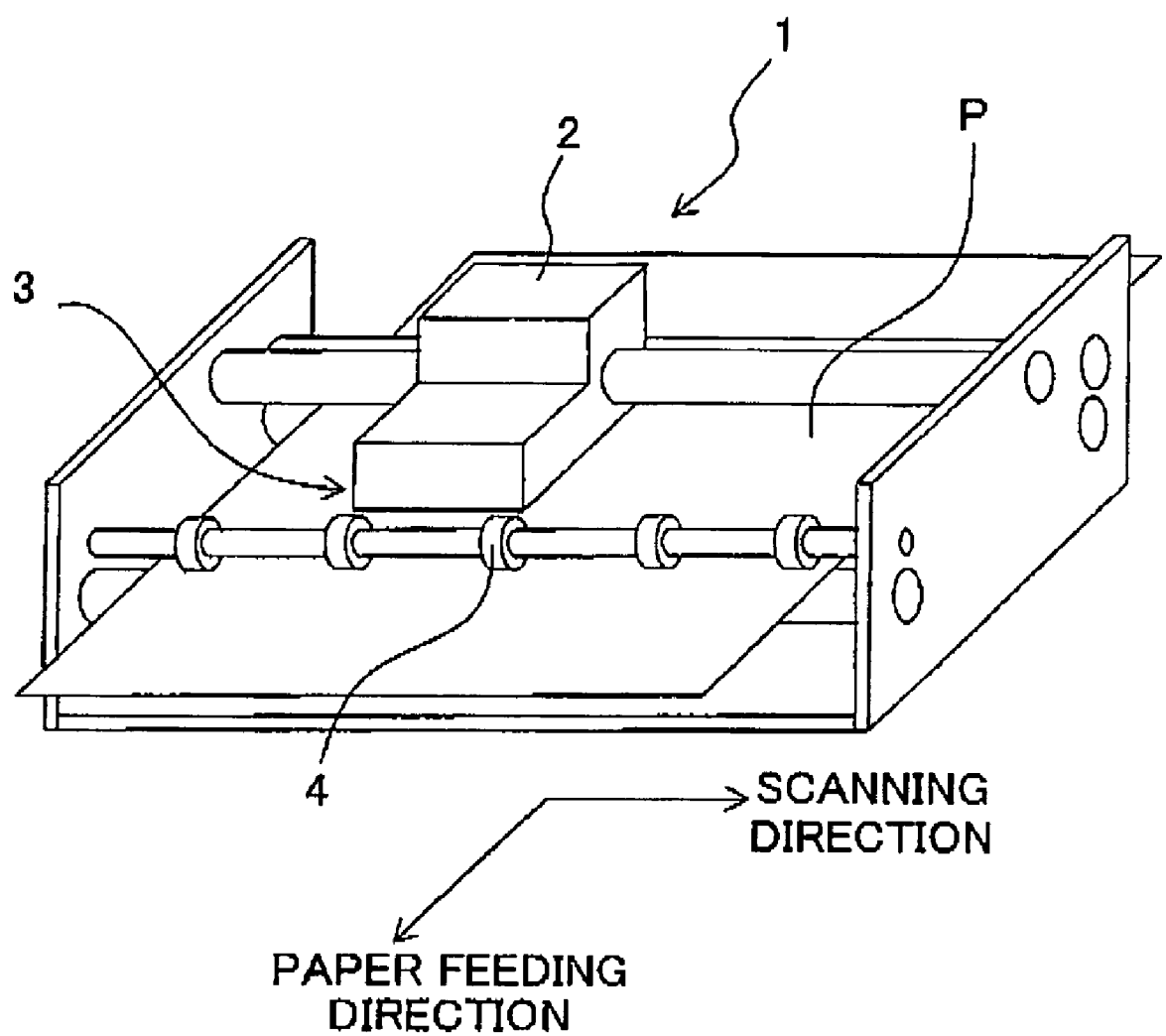
FIG. 1 is a schematic perspective view of an ink-jet printer 1 according to the present invention.

First, an ink-jet printer 1 which includes an ink-jet head 3 will be described briefly. As shown in FIG. 1, the ink-jet printer 1 includes a carriage 2 movable in a left and right direction in the drawing, an ink-jet head 3 (liquid transporting apparatus) of serial type which is provided on the carriage 2 and discharges ink onto a recording paper P, and transporting rollers 4 which carry the recording paper in a forward direction in FIG. 1. The ink-jet head 3 moves integrally with the carriage 2 in a left and right direction (scanning direction) and discharges ink onto the recording paper P from ejecting ports of nozzles 50 (refer to FIG. 2 and FIG. 3) formed in an ink-discharge surface of a lower surface of the ink-jet head 3. The recording paper P with an image recorded thereon by the ink-jet head 3 is discharged forward (paper feeding direction) by the transporting rollers 4.

Figure 2:
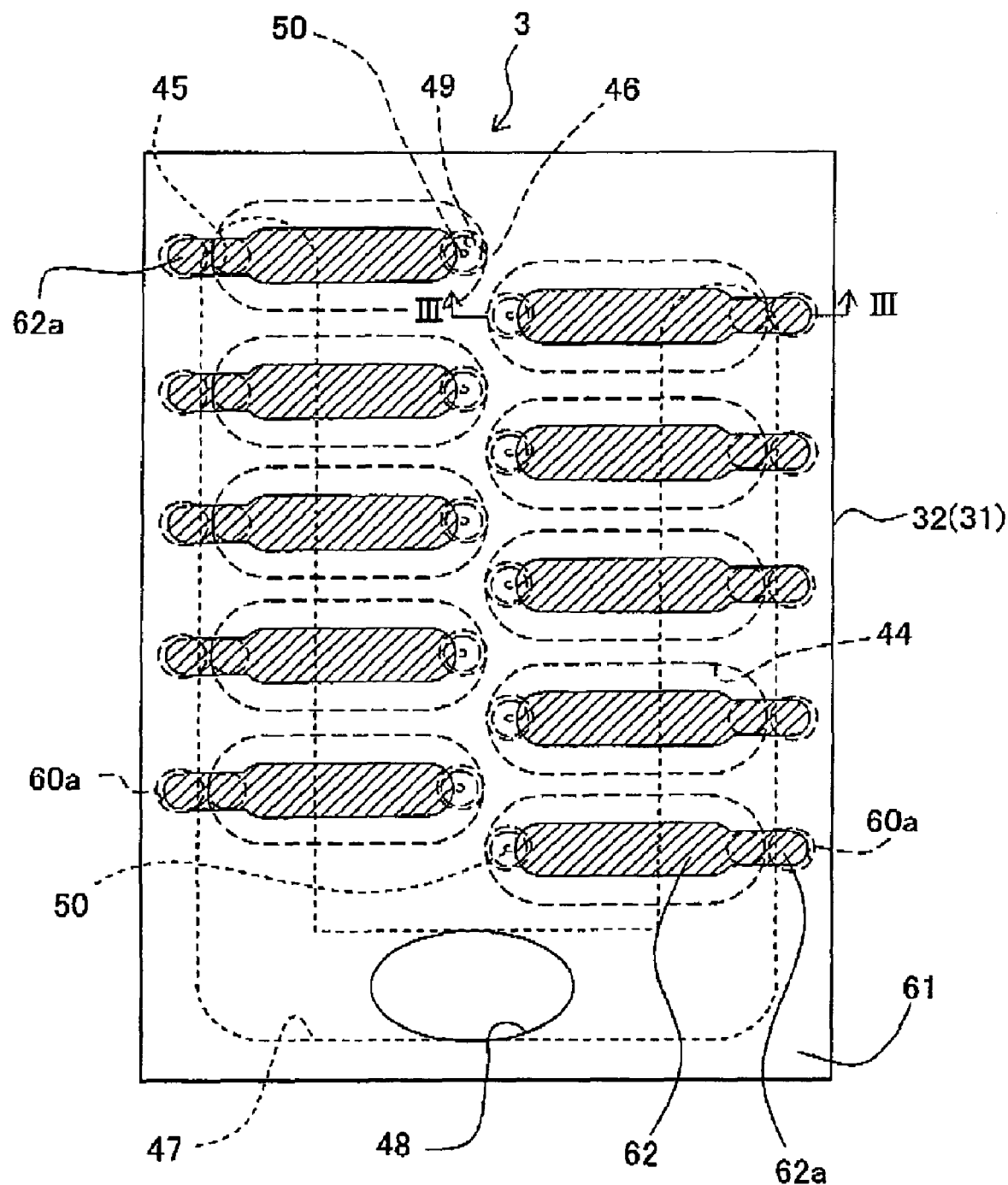
FIG. 2 is a partially-enlarged plan view of an ink-jet head 3 in FIG. 1.
Figure 3:
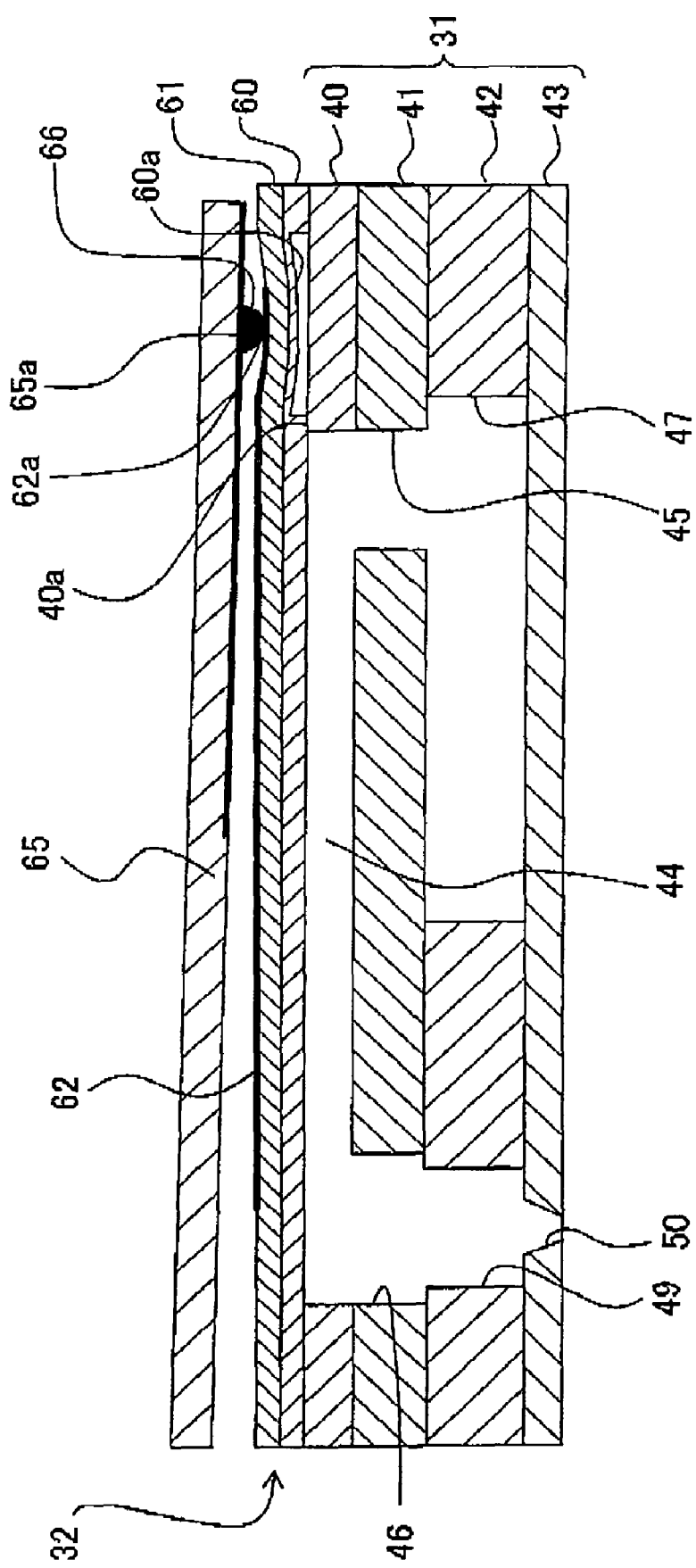
FIG. 3 is a cross-sectional view of FIG. 2 taken along a line III-III.

FIG. 2 is a partially enlarged view of the ink-jet head 3 in FIG. 1 and FIG. 3 is a cross-sectional view of FIG. 2 taken along a line III-III. As shown in FIG. 2 and FIG. 3, the ink-jet head 3 includes a channel unit 31 in which an ink channel is formed, and a piezoelectric actuator 32 which is arranged on an upper surface of the channel unit 31.

To start with, the channel unit 31 will be described below. As shown in FIG. 3, the channel unit 31 includes a cavity plate 40, a base plate 41, a manifold plate 42, and a nozzle plate 43, and these four plates are joined in stacked layers. Among these four plates, the cavity plate 40, the base plate 41, and the manifold plate 42 are substantially rectangular stainless steel plates. Moreover, the nozzle plate 43 is formed of a high-molecular synthetic resin material such as polyimide and is joined to a lower surface of the manifold plate 42. Or the nozzle plate 43 may also be formed of a metallic material such as stainless steel similar to the three plates 40 to 42.

As shown in FIG. 2 and FIG. 3, in the cavity plate 40 (pressure chamber plate), a plurality of pressure chambers 44 arranged along a plane is formed. A part of the plurality of pressure chambers 44 (10 pressure chambers) is shown in FIG. 2. Each pressure chamber 44 is substantially elliptical in a plan view and is arranged such that a long axis direction of the pressure chamber is the scanning direction (left and right direction in FIG. 2).

Communicating holes 45 and 46 are formed in the base plate 41 at positions which overlap, in a plan view, with both end portions of the associated pressure chamber 44 in the long axis direction of the pressure chamber. Moreover, in the manifold plate 42, a manifold 47 is formed. The manifold 47 is extended in two rows in the paper feeding direction (vertical direction in FIG. 2) and overlaps, in a plan view, with a left end portion or a right end portion of each of the pressure chambers 44 in FIG. 2. Ink is supplied to the manifold 47 from an ink tank (not shown in the diagram) via an ink supply port 48 formed in the cavity plate 40. Moreover, a communicating hole 49 is formed at a position overlapping in a plan view with an end portion of each of the pressure chambers 44 on the side opposite to the manifold 47. Furthermore, a plurality of nozzles 50 is formed in the nozzle plate 43 at positions each overlapping in a plan view with an end portion of each of the pressure chambers 44 on the side opposite to the manifold. The nozzles 50 are formed, by an excimer laser process on a substrate of a high-molecular synthetic resin such as polyimide.

As shown in FIG. 3, the manifold 47 communicates with the pressure chamber 44 via the communicating hole 45, and the pressure chamber communicates with the nozzle 50 via the communicating holes 46 and 49. Thus, a plurality of individual ink channels (liquid channels) from the manifold 47 up to the nozzles 50 via the pressure chambers 44 is formed in the channel unit 31.

Next, the piezoelectric actuator 32 will be described below. As shown in FIG. 3, the piezoelectric actuator 32 includes a vibration plate 60, a piezoelectric layer 61, a plurality of individual electrodes 62, and a flexible printed circuit board (FCC) 65. The vibration plate 60 which is electroconductive is arranged on a surface of the cavity plate 40 and joined to the cavity plate 40. The piezoelectric layer 61 is formed continuously on a surface of the vibration plate 60, spreading across the pressure chambers 44. The individual electrodes 62 are formed on the surface of the piezoelectric layer 61 corresponding to the respective pressure chambers 44. The flexible printed circuit board (FCC) 65 is provided over the individual electrodes. Furthermore, the cavity plate 40 (supporting member) of the channel unit 31 also constructs a part of the piezoelectric actuator 32. This cavity plate 40 has a joining section 40a joined to the vibration plate 60 and the pressure chamber 44 as a reliving section for relieving a deformation of the vibration plate 60.

The vibration plate 60 is made of a metallic material such as an iron alloy like stainless steel, a nickel alloy, an aluminum alloy, and a titanium alloy. The vibration plate 60 is joined to the joining section 40a of the cavity plate 40 such that the vibration plate 60 covers the plurality of pressure chambers 44. This vibration plate 60 faces the plurality of individual electrodes 62 and serves also as a common electrode which generates an electric field in the piezoelectric layer 61 between the individual electrodes 62 and the vibration plate 60. The vibration plate 60 is grounded and is kept at a ground potential. Moreover, as shown in FIG. 3, a recess 60a having a circular shape is formed in an area of the vibration plate 60 on a side of the cavity plate 40, the area being included, in a plan view, in the joining section 40a of the cavity plate 40. The recess 60a is formed in the vibration plate 60 by a method such as half etching.

The piezoelectric layer 61 which is composed of mainly lead zirconate titanate (PZT) which is a solid solution of lead titanate and lead zirconate, and is a ferroelectric substance, is formed on the surface of the vibration plate 60. The piezoelectric layer 61 is formed spreading across the pressure chambers 44. Therefore the piezoelectric layer 61 can be formed at one time for all the pressure chambers 44, thereby making the formation of the piezoelectric layer 61 easy. In this case, the piezoelectric layer 61 can be formed for example, by an aerosol deposition method (AD method) in which ultra fine particles of a piezoelectric material are deposited by causing the particles to collide at a high speed on the surface of the vibration plate 60. Other than the above, a method such as a sol-gel method, a sputtering method, a hydrothermal synthesis method, or a CVD (chemical vapor deposition) method can also be used to form the piezoelectric layer 61. Furthermore, the piezoelectric layer 61 can also be formed by sticking a piezoelectric sheet, obtained by baking a green sheet of PZT, on the surface of the vibration plate 60.

On the upper surface of the piezoelectric layer 61, the individual electrodes 62 having flat shape and substantially elliptical form and a size smaller than the size of the pressure chamber 44 to some extent are formed. Each of these individual electrodes 62 is formed to overlap with a central portion of the corresponding pressure chamber 44 in a plan view. The individual electrodes 62 are made of an electroconductive material such as gold, copper, silver, palladium, platinum, and titanium. Moreover, on the upper surface of the piezoelectric layer 61, a plurality of contact sections 62a are formed. Each of the contact sections 62a extends from one end portion (an end portion on the side of the manifold 47) of one of the individual electrodes 62 up to a portion facing the recess 60a which is positioned in the joining section 40a in plan view. The individual electrodes 62 and the contact sections 62a can be formed by a method such as screen printing, a sputtering method, and a vapor deposition method.

The FCC 65 includes terminal sections 65a corresponding to the contact sections 62a in the lower surface side of a substrate made of a material such as polyimide. On surfaces of these terminal sections 65a, a plurality of hemispherical bumps 66 made of solder and projecting toward the contact sections 62a are respectively formed. The contact sections 62a and the terminal sections 65a are electrically connected via the bumps 66. With the FCC 65 arranged on the piezoelectric layer 61, the bump 66 is included, in a plan view, completely inside the circular shaped recess 60a. In other words, a part of the recess 60a is right below the bump 66. Moreover, the FCC 65 is connected to a driver IC (not shown in the diagram) which supplies a drive signal.

As it will be described later, the contact sections 62a and the terminal sections 65a are connected by allowing the plurality of bumps 66 formed on the plurality of terminal sections 65a respectively to make a contact with the contact sections 62a of the plurality of individual electrodes 62, and by pressing the FCC 65 toward the individual electrodes 62 while heating the FCC 65 by a ceramic heater (not shown in the diagram) from a surface of the FCC 65 on a side opposite to the individual electrodes 62. As described before, the recess 62a is formed on the vibration plate 60 in an area facing the bump 66, thereby reducing the stiffness partially (reducing the area of the vibration plate in which the recess is formed). Therefore, the concentration of the stress acting on the piezoelectric layer 61 when the FCC 65 is pressed is relieved. This will be described later in further detail.

Here, an action of the piezoelectric actuator 32 will be described. When a drive voltage is selectively applied from the driver IC to the individual electrodes 62 via the FCC 65, an electric field in a vertical direction is generated in the piezoelectric layer 61 which is sandwiched between a portion of the piezoelectric layer 61 to which the drive voltage is supplied and the vibration plate 60 which serves also as the common electrode held at the ground potential. As the electric field is generated, a portion of the piezoelectric layer 61 directly under the individual electrodes 62 to which the drive voltage is applied is contracted in a horizontal direction which is perpendicular to a direction of thickness which is a direction of polarization. With the contraction of the part of the piezoelectric layer 61, the vibration plate 60 and the piezoelectric layer 61 in the area facing a pressure chamber 44 are deformed so as to project toward the pressure chamber 44. Accordingly, a volume of the pressure chamber 44 is decreased and there is a rise in an ink pressure. Therefore, the ink is discharged from the nozzle 50 communicating with the pressure chamber 44.

Next, a method of manufacturing the ink-jet head 3 which includes the piezoelectric actuator 3 2 of this embodiment will be described. FIG. 4 is a diagram showing a manufacturing process of the ink-jet head 3.

Figure 4A:
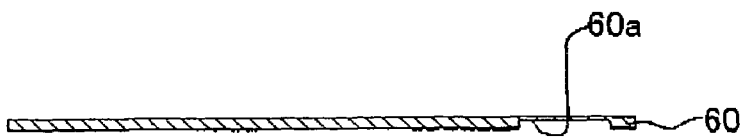
FIG. 4A is a cross-sectional view showing a first step in a manufacturing process of a piezoelectric actuator.

As shown in FIG. 4A, the recesses 60a are formed by half etching on a surface of the vibration plate 60 made of a metallic material on a side where the vibration plate 60 is joined to the cavity plate 40 (first step).

Figure 4B:
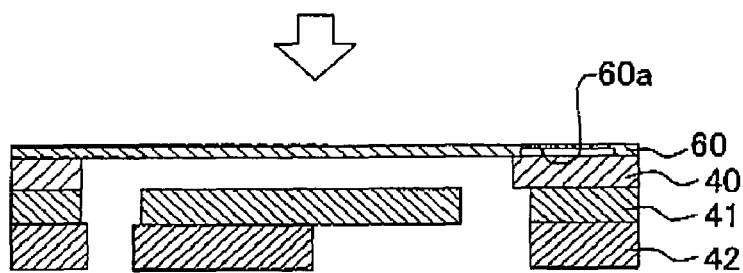
FIG. 4B is a cross-sectional view showing a second step in the manufacturing process of the piezoelectric actuator.

Next, as shown in FIG. 4B, the vibration plate 60, the cavity plate 40, the base plate 41, and the manifold plate 42 are joined (second step). The plates are joined by metal diffusion joining. Or the plates may be joined with an adhesive. In this step, at least the vibration plate 60 and the cavity plate 40 may be joined, and the base plate 41 and the manifold plate 42 may be joined later.

Figure 4C:
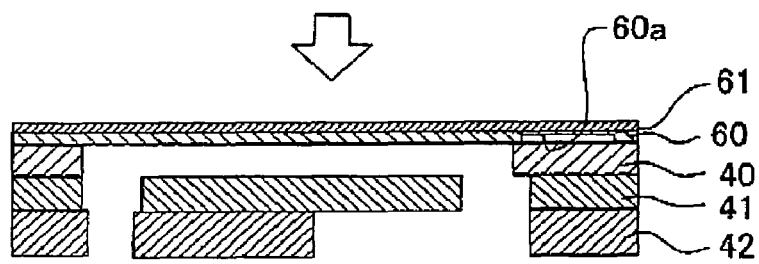
FIG. 4C is a cross-sectional view showing a third step in the manufacturing process of the piezoelectric actuator.

As shown in FIG. 4C, the PZT is formed on the surface of the vibration plate on the side opposite to the cavity plate 40 by a method such as the aerosol deposition method (AD method), the sol-gel method, the sputtering method, the hydrothermal synthesis method, or the CVD (chemical vapor deposition) method, thereby forming the piezoelectric layer 61 (third step). In this case, by forming the piezoelectric layer 61 by using a method such as the AD method, the sol-gel method, the sputtering method, the hydrothermal synthesis method, or the CVD method, a thin piezoelectric layer 61 can be formed easily and the manufacturing process can be simplified. The piezoelectric layer 61 may also be formed by sticking, on the surface of the vibration plate 60, the piezoelectric sheet obtained by baking the green sheet of PZT.

Figure 4D:
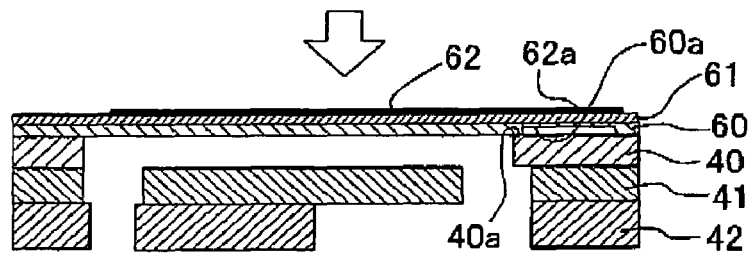
FIG. 4D is a cross-sectional view showing a fourth step in the manufacturing process of the piezoelectric actuator.

Further, as shown in FIG. 4D, the individual electrodes 62 are formed on a surface of the piezoelectric layer 61 on a side opposite to the vibration plate, in an area of this surface facing the pressure chambers 44, and the contact sections 62a are formed in an area facing the joining sections 40a and in an area facing the recesses 60a (fourth step).

Figure 4E:
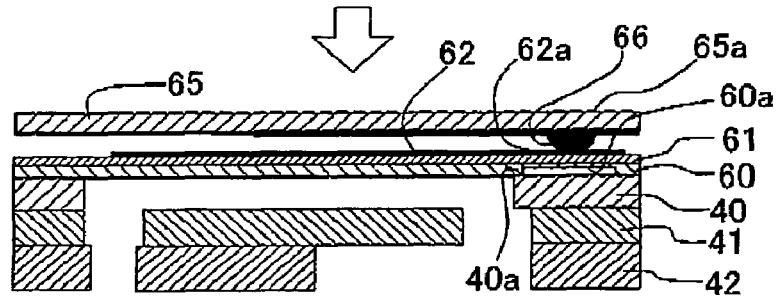
FIG. 4E is a cross-sectional view showing a fifth step and a sixth step in the manufacturing process of the piezoelectric actuator.

As shown in FIG. 4E, the bumps 66 projecting toward the individual electrodes 62 are formed by soldering or the like on the terminal sections 65a of the FCC 65 (fifth step). Further, the contact sections 62a and the bumps 66 are positioned to make a contact with each other, and the contact sections 62a of the individual electrodes 62 and the terminal sections 65a of the wire member 65 are electrically connected via the bumps 66 by pressing the FCC 65 toward the individual electrodes 62 while heating the FCC 65 by a ceramic heater from the surface of the FCC 65 on the side opposite to the individual electrodes 62 (sixth step).

in this case, since the recesses 60a are provided in the area facing the bumps 66, while joining the contact sections 62a and the bumps 66, a stress acts on the piezoelectric layer 61 due to pressing the FCC by using the ceramic heater or the like toward the individual electrodes 62, and in the area facing the recesses 60a, the vibration plate 60 and the piezoelectric layer 61 are bent toward the recesses 60a. Accordingly, the concentration of the stress in the piezoelectric layer 61 in the area facing the bumps 66 is relieved and the damage of the piezoelectric layer 61 can be prevented.

When there is an unevenness in height of the bumps 66, when the FCC 65 is pressed towards the individual electrodes 62 by the ceramic heater, first of all, the bumps 66 having greater height come in contact with the contact sections 62a. At this time, the contact sections 62a corresponding to the bumps having the greater height are pressed by the bumps having greater height, and the vibration plate 60 and the piezoelectric layer 61 in an area facing the portion in which these bumps 66 and the contact sections 62a are in contact is bent toward the recesses 60a, and as a result, the bumps 66 having a smaller height also come in contact with the contact sections 62a. Accordingly, an adhesion between the bumps 66 and the contact sections 62a is improved, and any poor contact between the contact sections 62a and the terminal section 65a can be prevented.

Figure 4F:
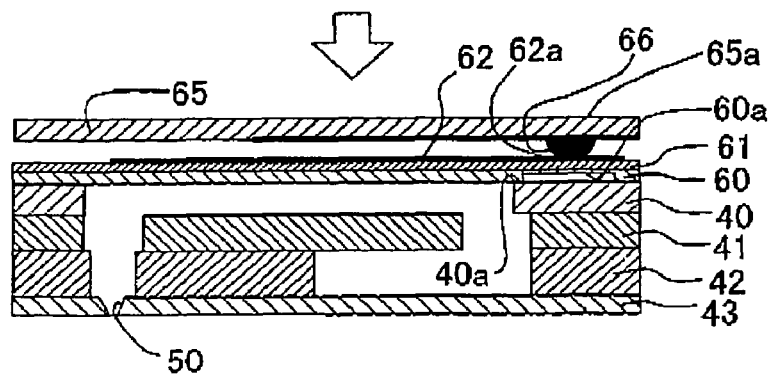
FIG. 4F is a cross-sectional view showing a seventh step in the manufacturing process of the piezoelectric actuator.

As shown in FIG. 4F, the nozzle plate 43 is joined with an adhesive or the like to a lower surface of the manifold plate 42 (seventh step). Thus, the ink-jet head 3 is manufactured. When the nozzle plate 43 is made of a metallic material, in the second step, the nozzle plate 43 may be joined at the same time.

A more specific example of the embodiment described above will be given. When the thickness of the vibration plate 60 is made to be 20 µm, the diameter of the circular recesses 60a is made to be 180 µm, the depth of the circular recesses 60a is made to be 10 µm, the thickness of the piezoelectric layer 61 is made to be 10 µm, and the pressing weight of the bumps 66 is made to be 30 g, in the area where the recesses 60a are formed, the vibration plate 60 can be deformed by about 2 µm, and even if there is an unevenness in height of the bumps 66 of about 2 µm, the contact sections 62a and the terminal sections 65a can be joined stably. More generally, in order to relieving the stress due to the pressed weight from the bumps while considering the unevenness (about 2 μm) in the height of bumps and the pressed weight (20 to 30 g) of the bumps, it is desirable that a size (diameter) of the recess 60a is not less than four times of a sum of thicknesses of the vibration plate 60 and the piezoelectric layer 61. In particular, it is desirable that the size of the recess 60a is not less than six times of the sum of the thicknesses of the vibration plate 60 and the piezoelectric layer 61. In the embodiment described above, the recess 60a is circular in shape. However, the recess may have any shape such as a rectangular shape or a polygonal shape, and even in such case the size (length) mentioned above is desirable.

Next, modified embodiments in which various modifications are made to this embodiment will be described. Same reference numerals are used for components or elements having a structure similar to the structure of this embodiment and description of such components is omitted.

First Modified Embodiment

Figure 5:
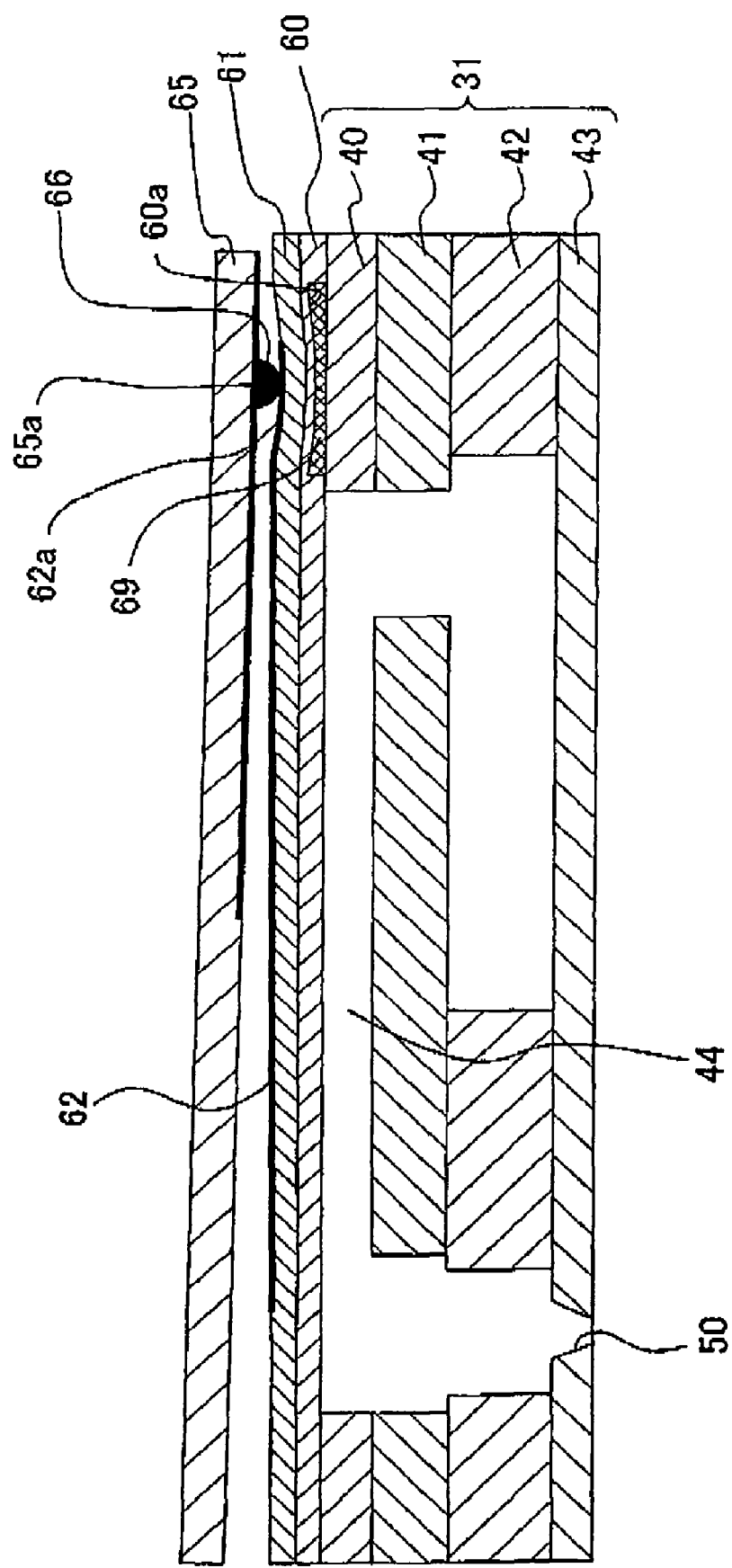
FIG. 5 is a cross-sectional view of an ink-jet head in a first modified embodiment.

As shown in FIG. 5, a low-elasticity material 69 such as a synthetic resin material, having a lower elasticity than an elasticity of the vibration plate 60 and an elasticity of the cavity plate 40, may be filled in the recess 60a formed in the vibration plate 60. This low-elasticity material 69 is filled in the recess 60a while performing the second step. Even in this case, similarly as in the embodiment described above, the concentration of stress on the piezoelectric layer 61 can be relieved by the low-elasticity material 69, and the unevenness in height of the bumps 60 can be absorbed. Accordingly, it is possible to prevent any poor connection between the contact sections 62a and the terminal sections 65a.

Second Modified Embodiment

Figure 6:
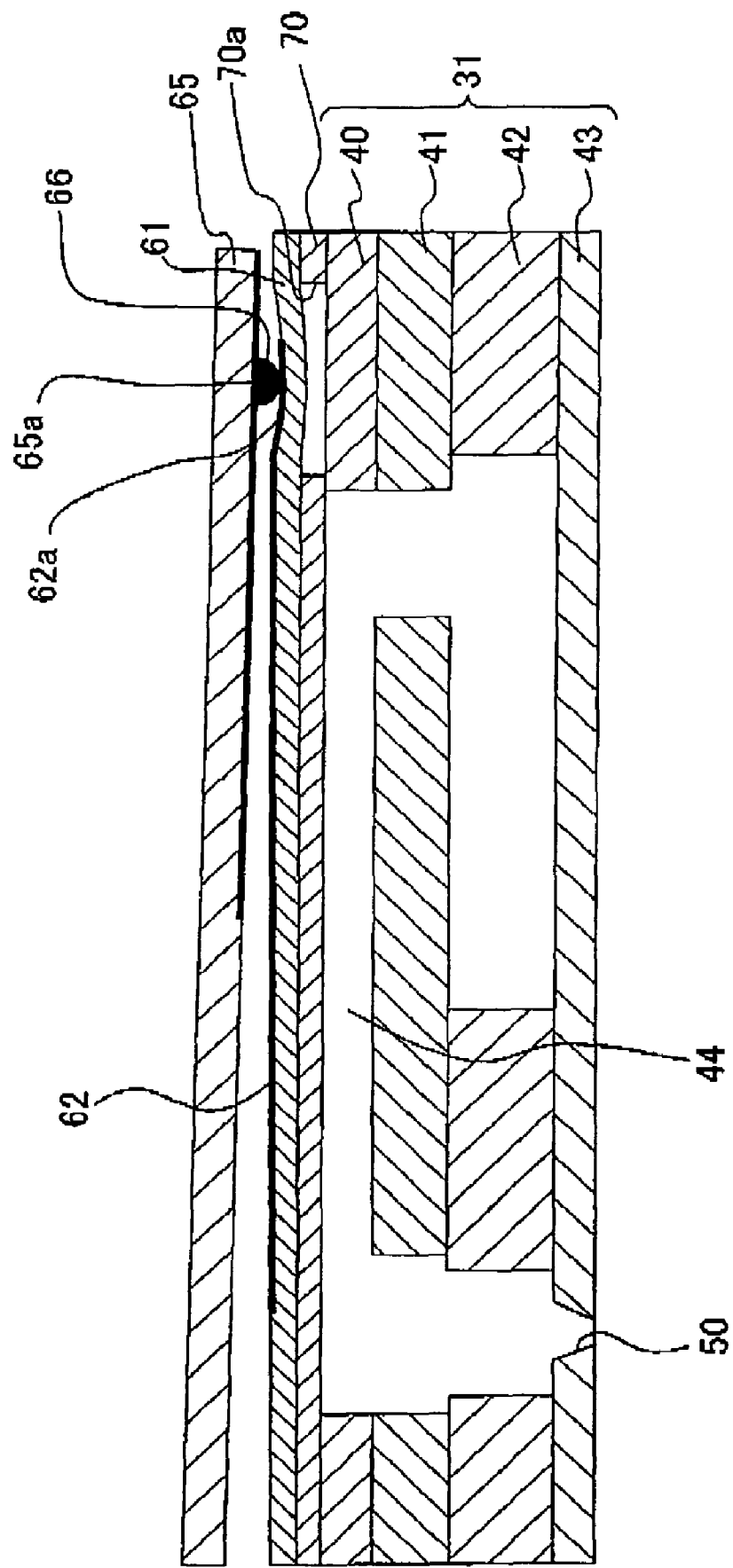
FIG. 6 is a cross-sectional view of an ink-jet head in a second modified embodiment.

As shown in FIG. 6, a through hole 70a may be formed in a vibration plate 70 in the area facing the bump 66. In this case, the piezoelectric layer 61 is formed by sticking, on the vibration plate 70, the piezoelectric sheet made from the baked green sheet. Here, the hole 70a is formed, for example, by performing full etching on the vibration plate 70. Even in this case, similarly as in the embodiment described above, the concentration of stress on the piezoelectric layer 61 can be relieved by the hole 70a, and the unevenness in height of the bumps 66 can be absorbed. Accordingly, it is possible to prevent any poor connection between the contact sections 62a and the terminal sections 65a.

Third Modified Embodiment

Figure 7:
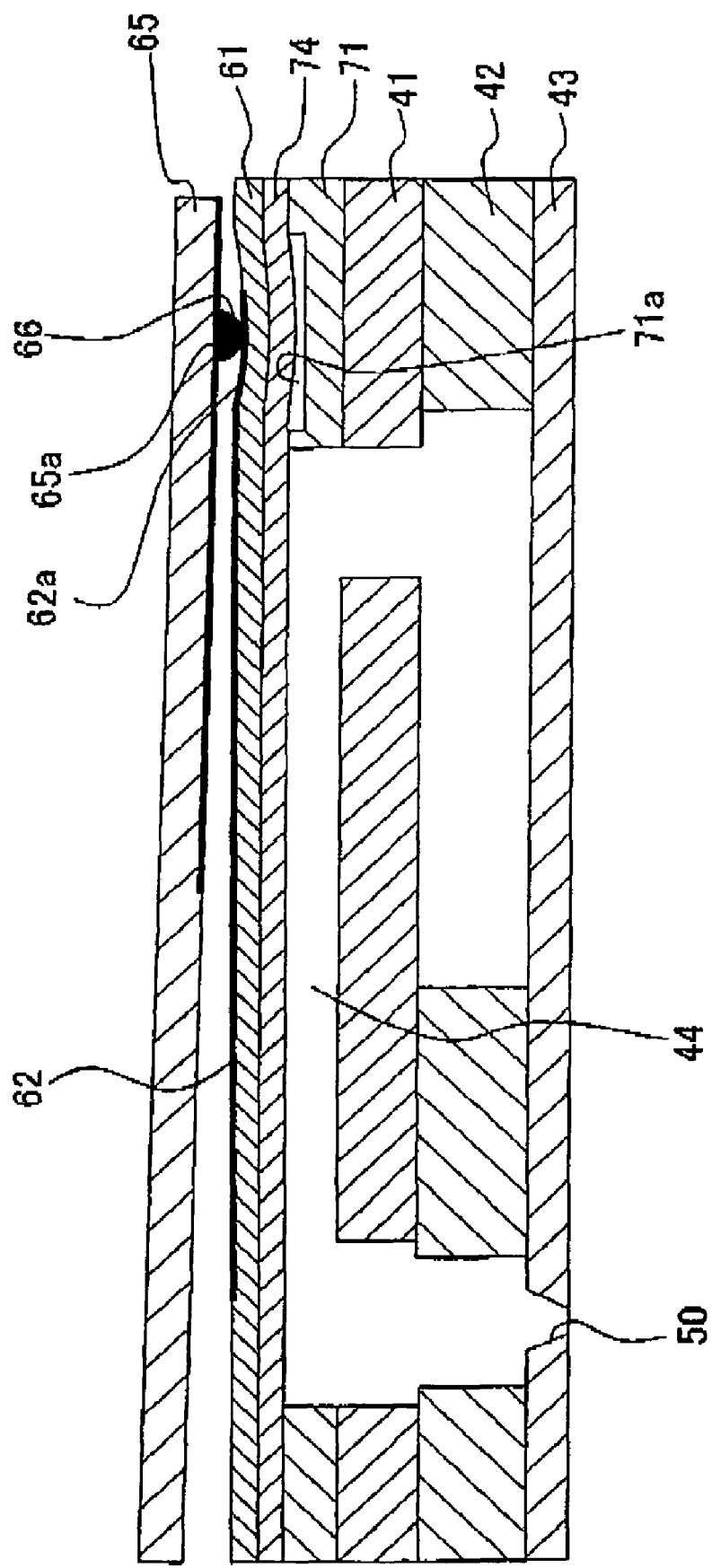
FIG. 7 is a cross-sectional view of an ink-jet head in a third modified embodiment.

As shown in FIG. 7, a recess 71a may be formed in a surface of a cavity plate 71 on a side of a vibration plate 74. In this case, similarly as in the embodiment described above, the concentration of stress on the piezoelectric layer 61 can be relieved by the recess 71a, and the unevenness in height of the bumps 66 can be absorbed. Accordingly, it is possible to prevent any poor connection between the contact sections 62a and the terminal sections 65a.

Fourth Modified Embodiment

Figure 8:
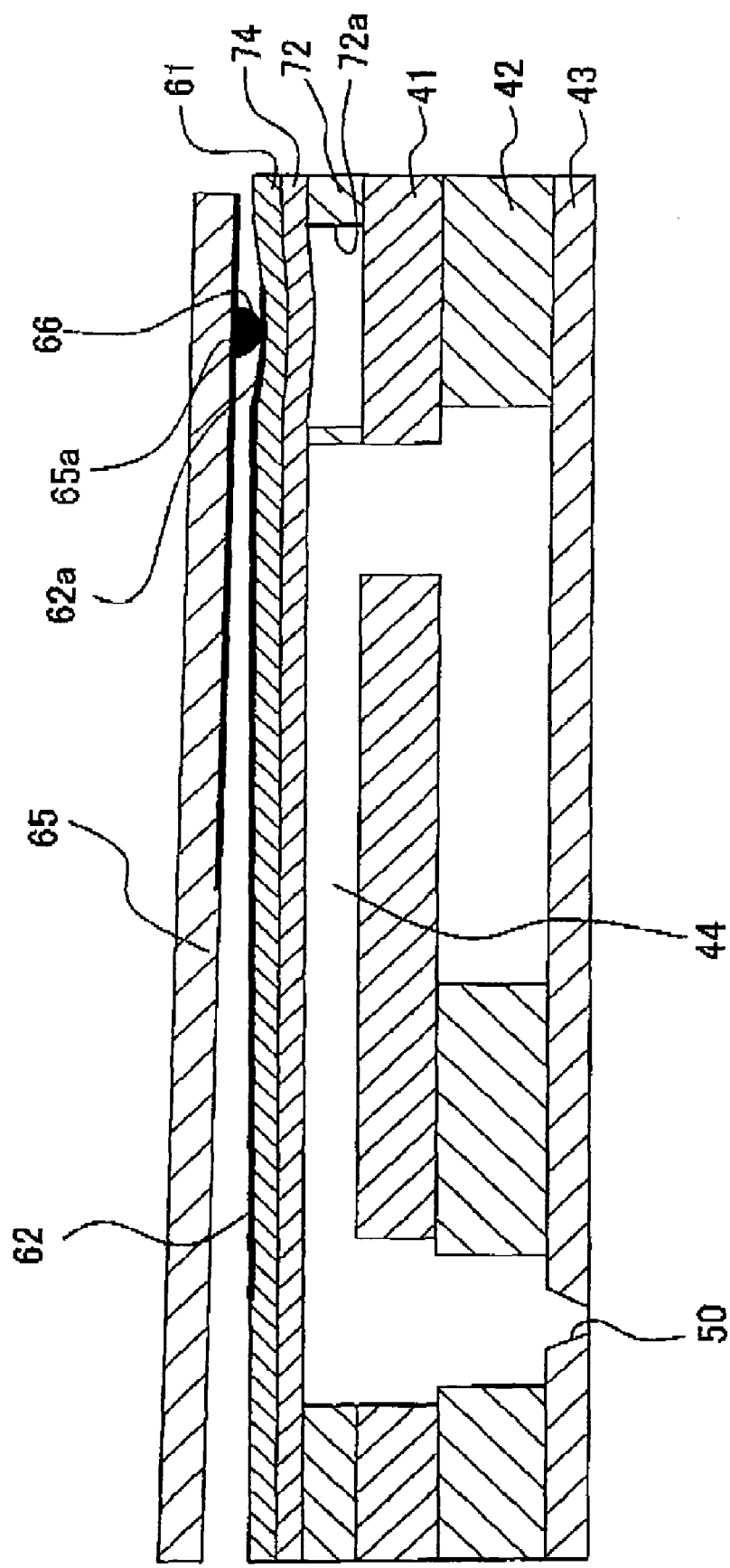
FIG. 8 is a cross-sectional view of an ink-jet head in a fourth modified embodiment.

As shown in FIG. 8, even in a case where a through hole 72a is formed in a cavity plate (supporting member) 72 in an area facing the bump 66, an effect similar to the effect in the third modified embodiment can be achieved. Moreover, a low elasticity material having a coefficient of elasticity smaller than a coefficient of elasticity of the vibration plate 74 and the coefficient of elasticity of the piezoelectric layer 61 may be filled in the recess 71a of the third modified embodiment and the hole 72a of the fourth modified embodiment.

Fifth Modified Embodiment

Figure 9:
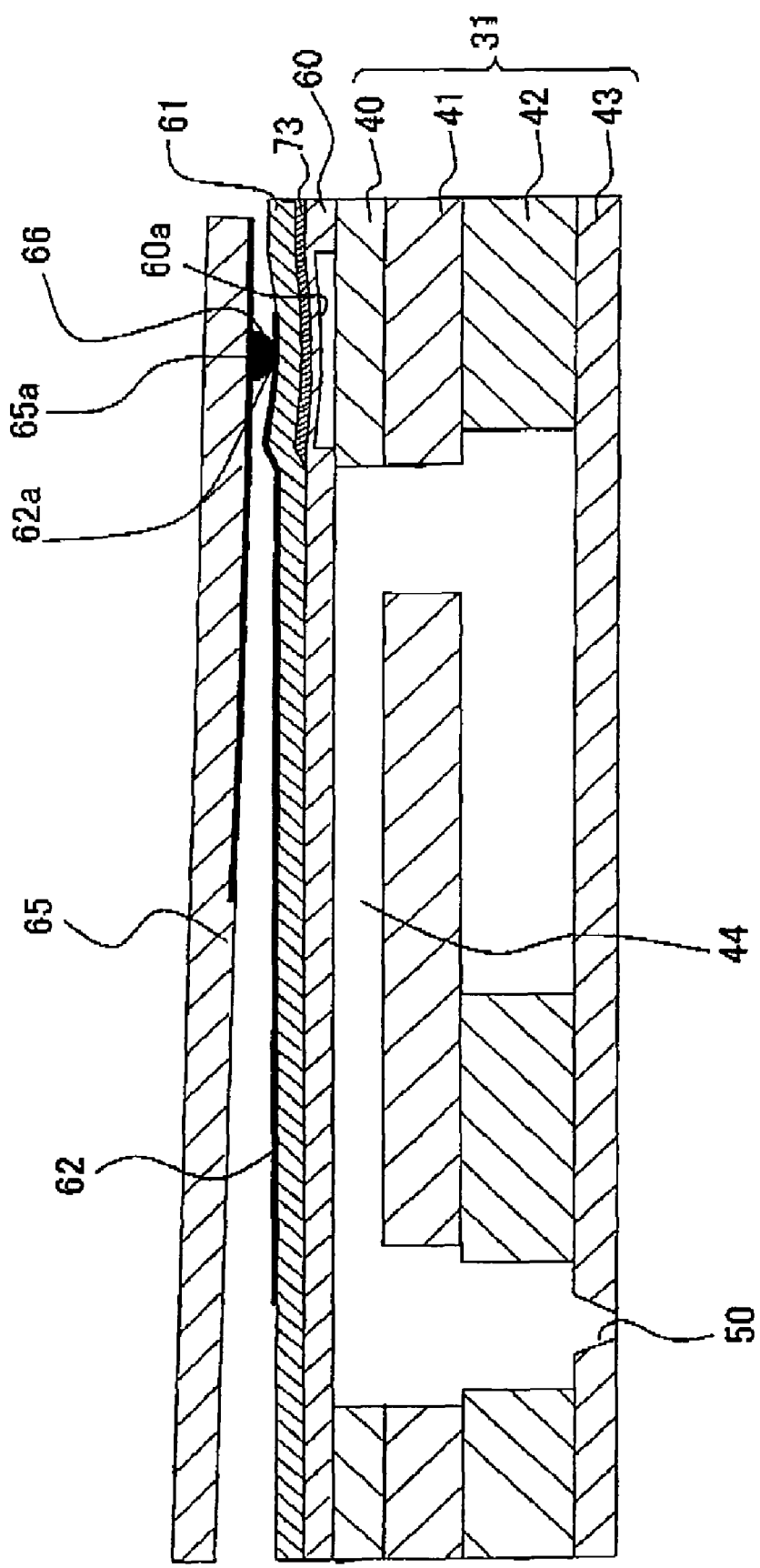
FIG. 9 is a cross-sectional view of an ink-jet head in a fifth modified embodiment.

As shown in FIG. 9, an insulating layer 73 may be interposed in an area between the piezoelectric layer 61 and the vibration plate 60, the area covering the recess 60a in a plan view. The insulating layer 73 is formed by a method such as screen printing between the second step and the third step. In this case, an electrostatic capacitance of the piezoelectric layer 61 sandwiched between the vibration plate 60 and the individual electrodes 62, in an area facing the insulating layer 73, is decreased, and the drive efficiency of the piezoelectric actuator is improved. Moreover, when the insulating layer 73 is made of a material having a coefficient of elasticity smaller than the coefficient of elasticity of the piezoelectric layer 61 and the coefficient of elasticity of the vibration plate 60, the effect of relieving of the concentration of stress in the piezoelectric layer 61 and the effect of prevention of any poor connection between the contact sections 62a and the terminal sections 65a, are further improved.

Sixth Modified Embodiment

Figure 10:
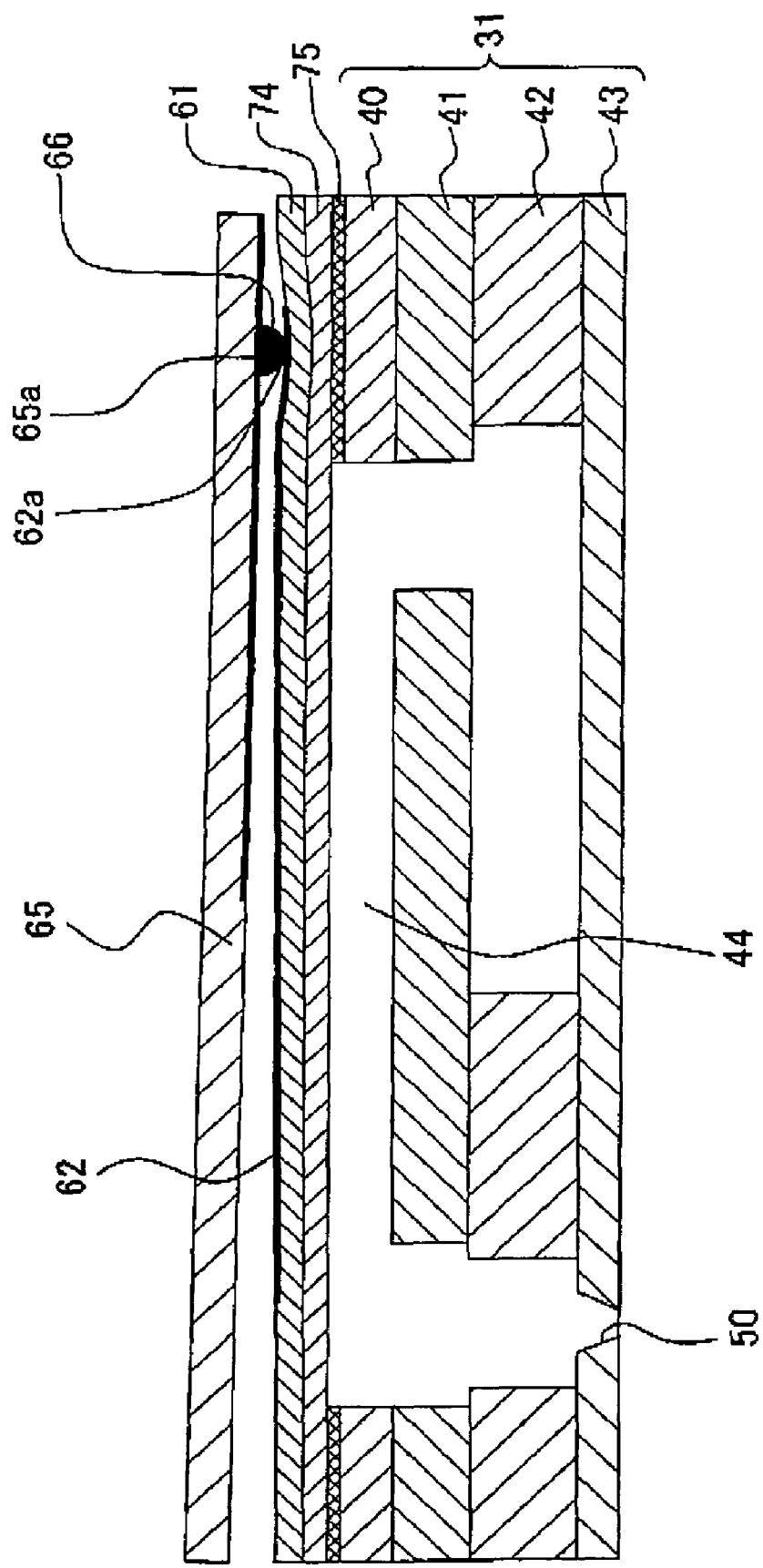
FIG. 10 is a cross-sectional view of an ink-jet head in a sixth modified embodiment.

As shown in FIG. 10, no recess or no hole may be formed in the vibration plate 74 and the cavity plate 40, but only a low-elasticity material 75 having a coefficient of elasticity smaller than the coefficient of elasticity of the vibration plate 74 and the coefficient of elasticity of the cavity plate 40 may be interposed between the vibration plate 74 and the cavity plate 40. The low-elasticity material 75 is formed before the second step by a method such as screen printing on a surface of the cavity plate 40 on the side of the vibration plate 60. Even in this case, similarly as in the embodiment described above, the concentration of stress on the piezoelectric layer 61 can be relieved by the low-elasticity material 75, and the unevenness in height of the bumps 66 can be absorbed. Accordingly, it is possible to prevent any poor connection between the contact section 62a and the terminal section 65a. In FIG. 10, the low-elasticity material 75 is formed on the cavity plate 41 in an area corresponding to the joining section 40a. However, the low-elasticity material 75 may be formed at least in the area facing the bump 66.

Seventh Modified Embodiment

Figure 11:
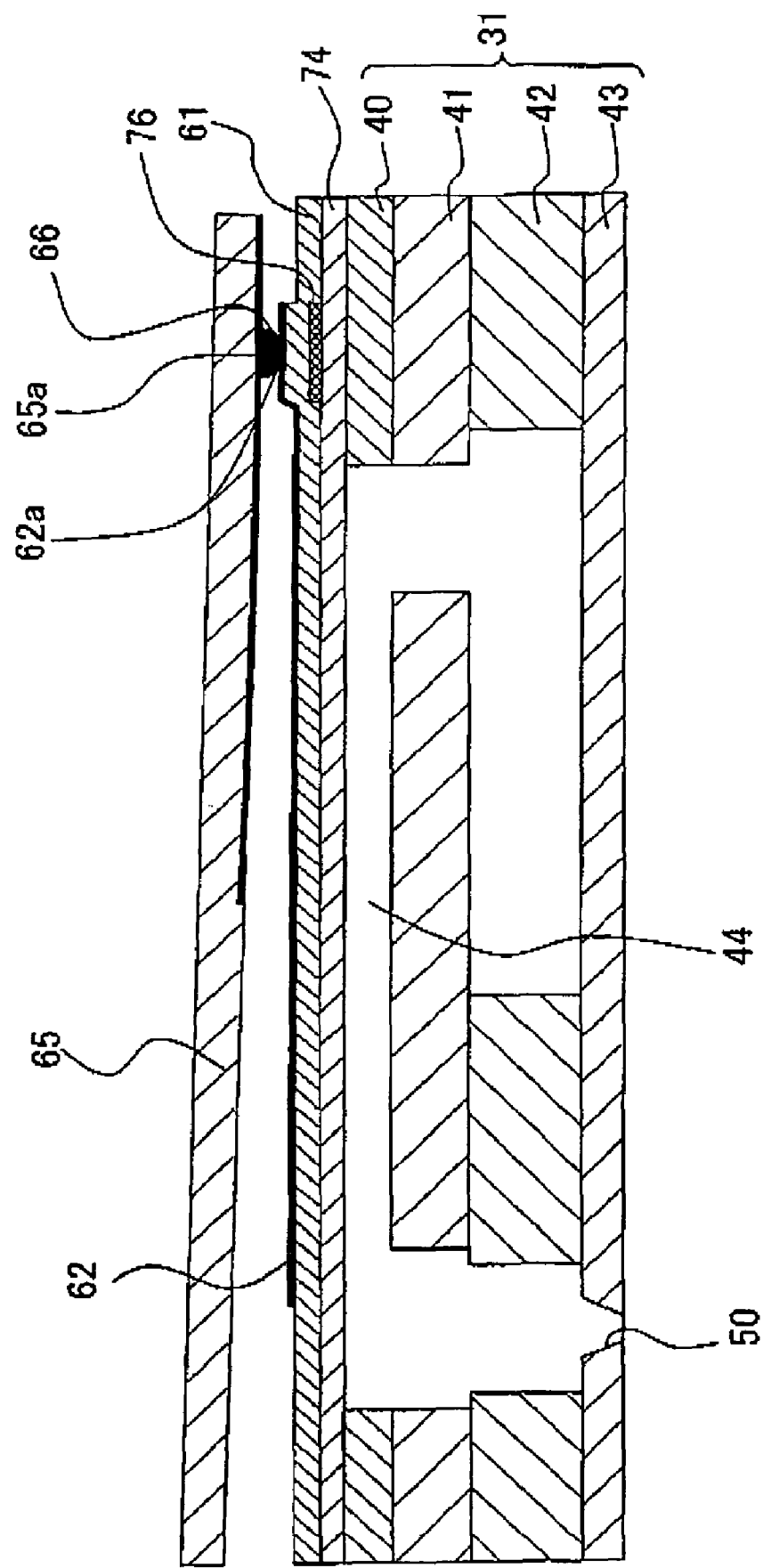
FIG. 11 is a cross-sectional view of an ink-jet head in a seventh modified embodiment.

As shown in FIG. 11, no recess or no hole may be formed in the vibration plate 74 and the cavity plate 40, but only a low elasticity material 76 having a coefficient of elasticity smaller than the coefficient of elasticity of the vibration plate 74 and the coefficient of elasticity of the piezoelectric layer 61 may be interposed in a narrow area (diameter of, for example, four to six times of a sum of the thickness of the vibration plate 74 and the thickness of the piezoelectric layer 61), the narrow area being between the vibration plate 74 and the piezoelectric layer 61 and facing the bump 66. The low-elasticity material 76 is formed before the third step by a method such as screen printing on the surface of the vibration plate 74 on the side of the piezoelectric layer 61. Even in this case, similarly as in the embodiment described above, the concentration of stress on the piezoelectric layer 61 can be relieved by the low-elasticity material 76, and the unevenness in height of the bumps 66 can be absorbed. Accordingly, it is possible to prevent any poor connection between the contact section 62a and the terminal section 65a. Thus, as a result of providing the low-elasticity material 76 only in the narrow area between the vibration plate 74 and the piezoelectric layer 61 and facing the bump 66, a projection is formed on the piezoelectric layer 61 in an area corresponding to the narrow area where the low-elasticity material 76 is provided. A portion of an electrode on the projection constructs the contact section 62a with the bump 66.

Eighth Modified Embodiment

Figure 12:
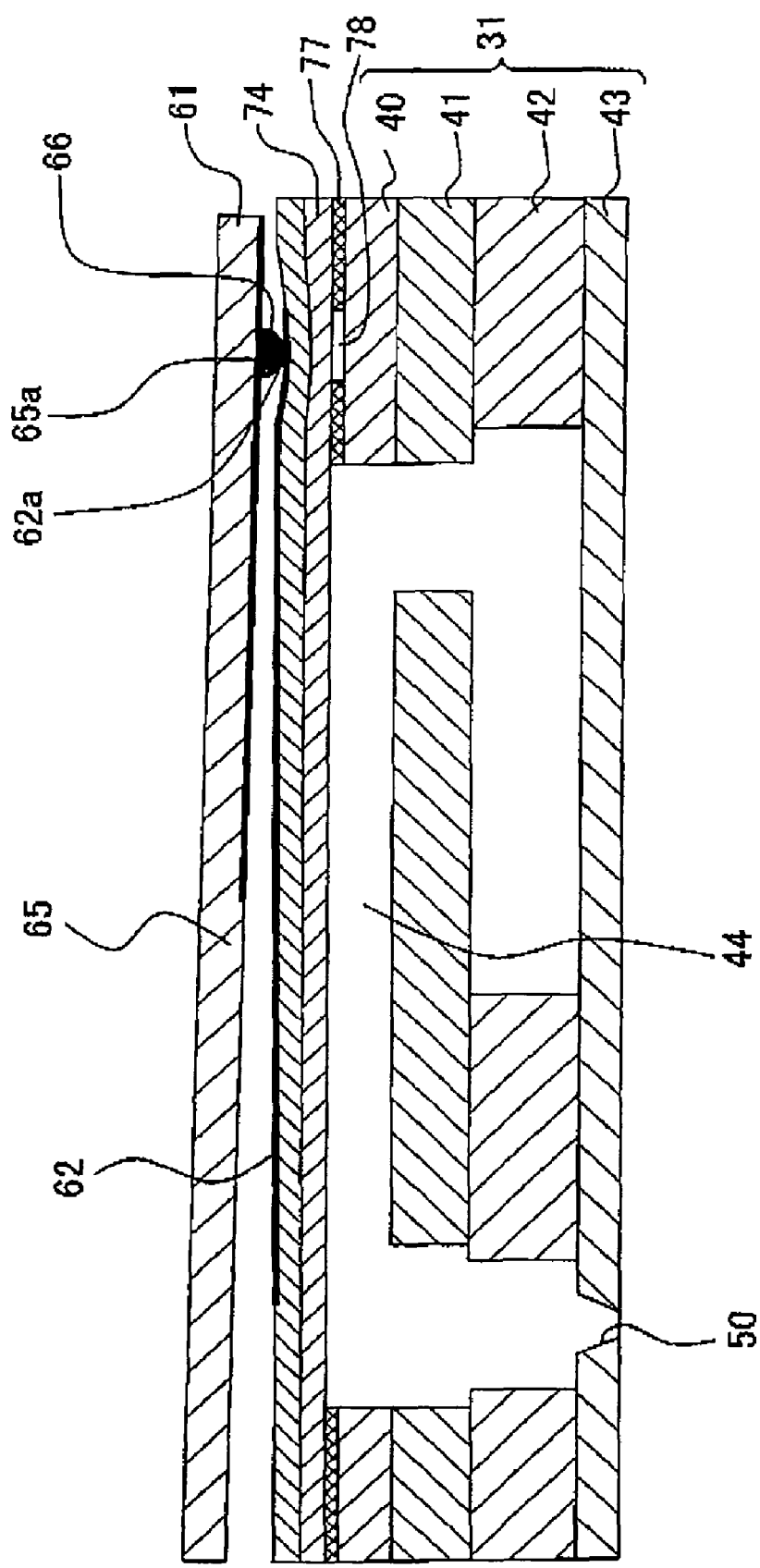
FIG. 12 is a cross-sectional view of an ink-jet head in an eighth modified embodiment.

As shown in FIG. 12, when the vibration plate 74 and the cavity plate 40 are adhered by an adhesive, the vibration plate 74 and the cavity plate 40 may be joined by transferring an adhesive layer 77 joining the vibration plate 74 and the cavity plate 40 only to a portion of the joining section 40a which does not face or overlap the bump 66 In this case, a cavity 78 is formed in the adhesive layer 77 in the area which does not face or overlap the bump 66. Thus, by the aid of the cavity 78, similarly as in the embodiment described above, the concentration of stress on the piezoelectric layer 61 can be relieved, and the unevenness in height of the bumps 66 can be absorbed. Accordingly, it is possible to prevent any poor connection between the contact section 62a and the terminal section 65a.

Ninth Modified Embodiment

Figure 13:
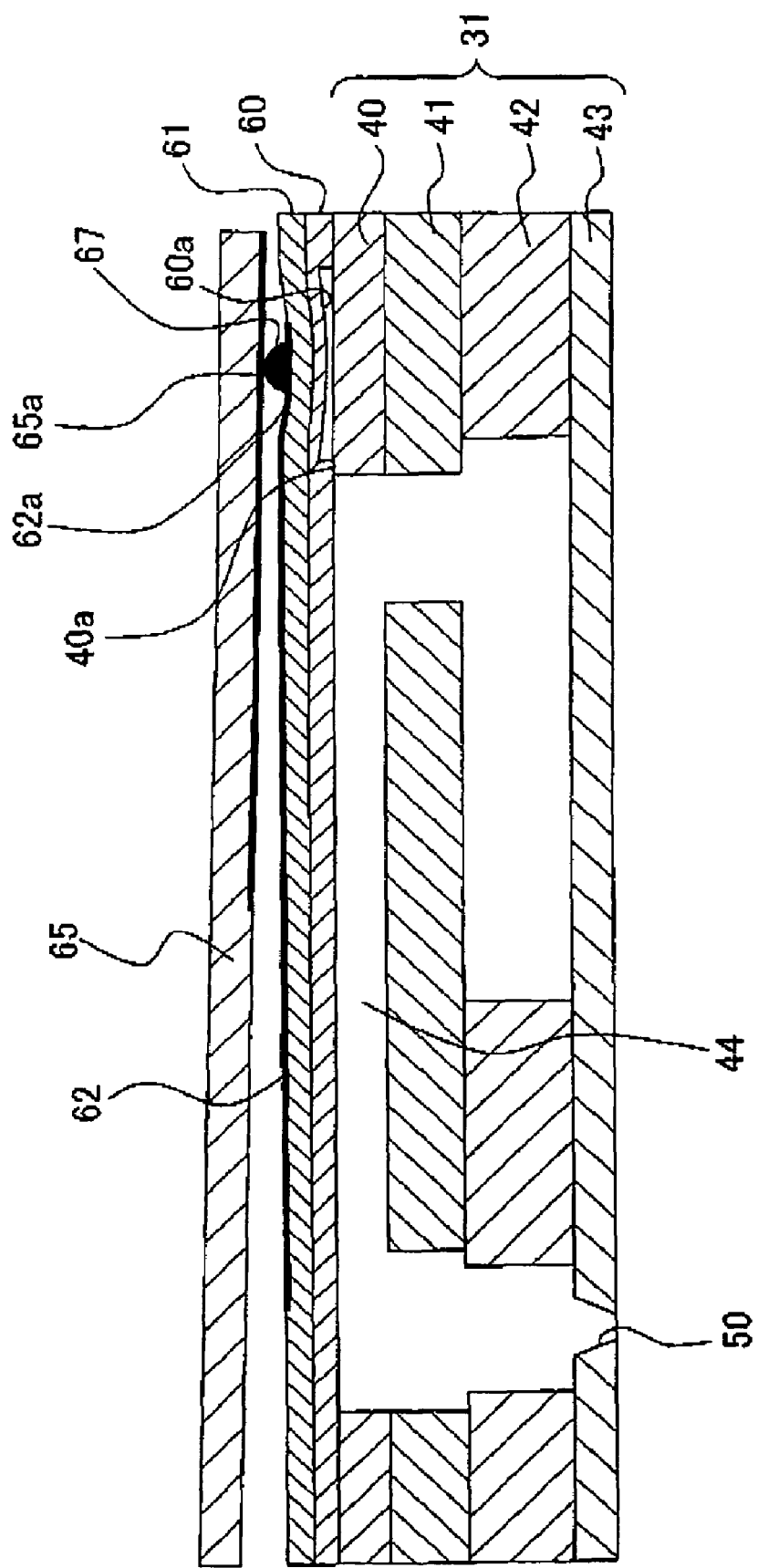
FIG. 13 is a cross-sectional view of an ink-jet head in a ninth modified embodiment.

In the embodiment described above, the bump 66 is provided to the side of the FCC 65. However, as shown in FIG. 13, a bump 67 may be formed on a surface of the contact section 62a on the side opposite to the piezoelectric layer 61 such that the bump 67 is projected toward the FCC 65. Even in this case, after the bump 67 and the terminal section 65a are positioned to make a contact with each other, the contact section 62a and the terminal section 65a can be electrically connected by heating and pressurizing the FCC 65 from a surface of the FCC 65 on the side opposite to the piezoelectric layer 61.

Tenth Modified Embodiment

Figure 14:
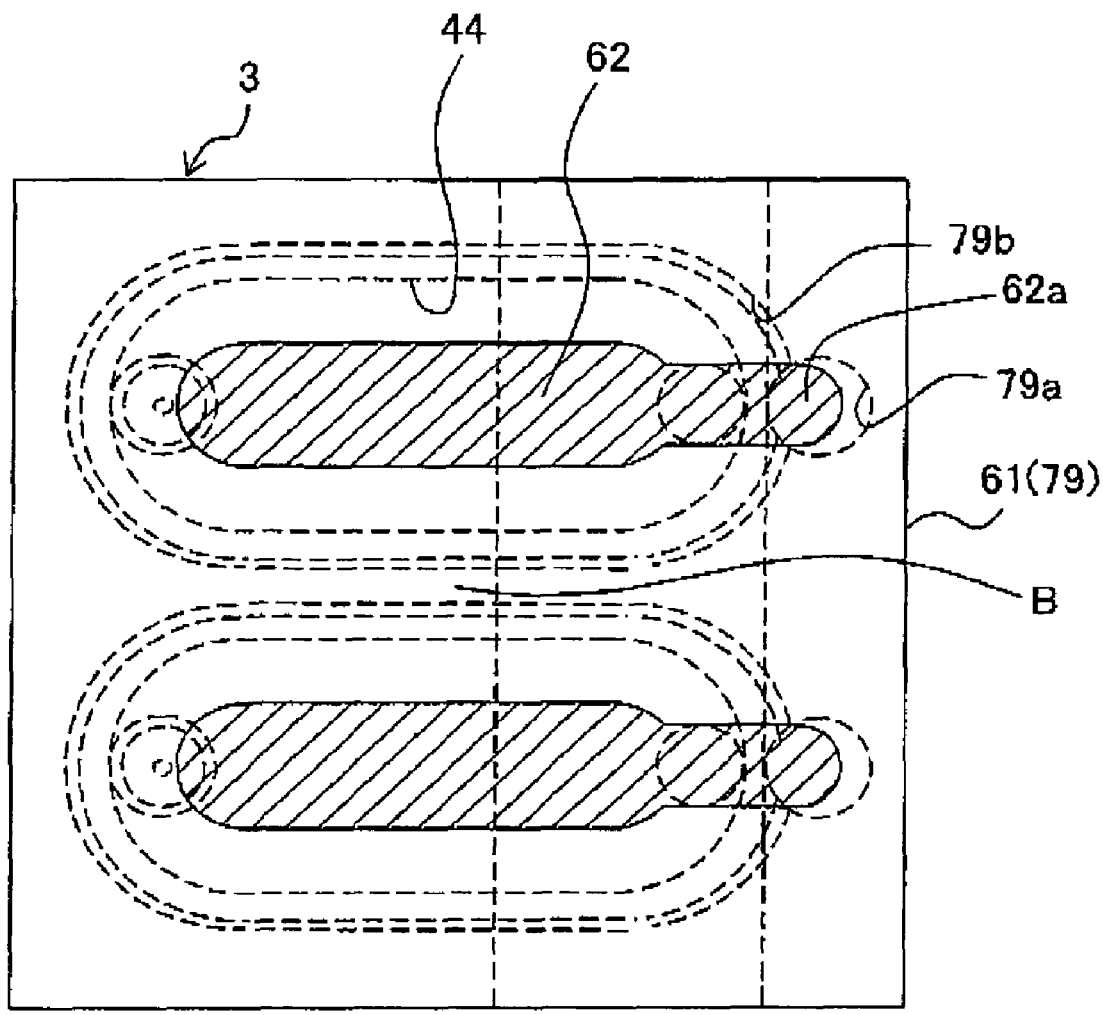
FIG. 14 is a partially magnified plan view of an ink-jet head in a tenth modified embodiment.

As shown in FIG. 14, a groove 79b may be extended from a recess 79a formed in the vibration plate 79 on the side of the cavity plate, up to a portion between a pressure chamber 44 corresponding to an individual electrode 62 having the contact section 62a facing the recess 79a and another pressure chamber 44 adjacent to this pressure chamber 44. In other words, the groove 79b may extend up to the shortest portion (area B) of a distance between the pressure chambers. Here, the recess 79a and the groove 79b can be formed at the same time by half etching. In this case, since the recess 79b exists between the plurality of pressure chambers, it is possible to suppress a phenomenon (cross talk) which occurs while operating the pressure chambers 44 and in which the deformation of the vibration plate 79 and the piezoelectric layer 61 in an area facing a pressure chamber 44 is propagated to the vibration plate 79 and the piezoelectric layer 61 in an area facing other pressure chamber 44. Accordingly, ink-discharge characteristic of the ink-jet head 3 is improved and a quality of printing is improved. To suppress the cross talk assuredly, it is desirable that the groove 79b, as shown in FIG. 14, is a groove having a shape of a ring surrounding each of the pressure chambers 44.

Eleventh Modified Embodiment

Figure 15:
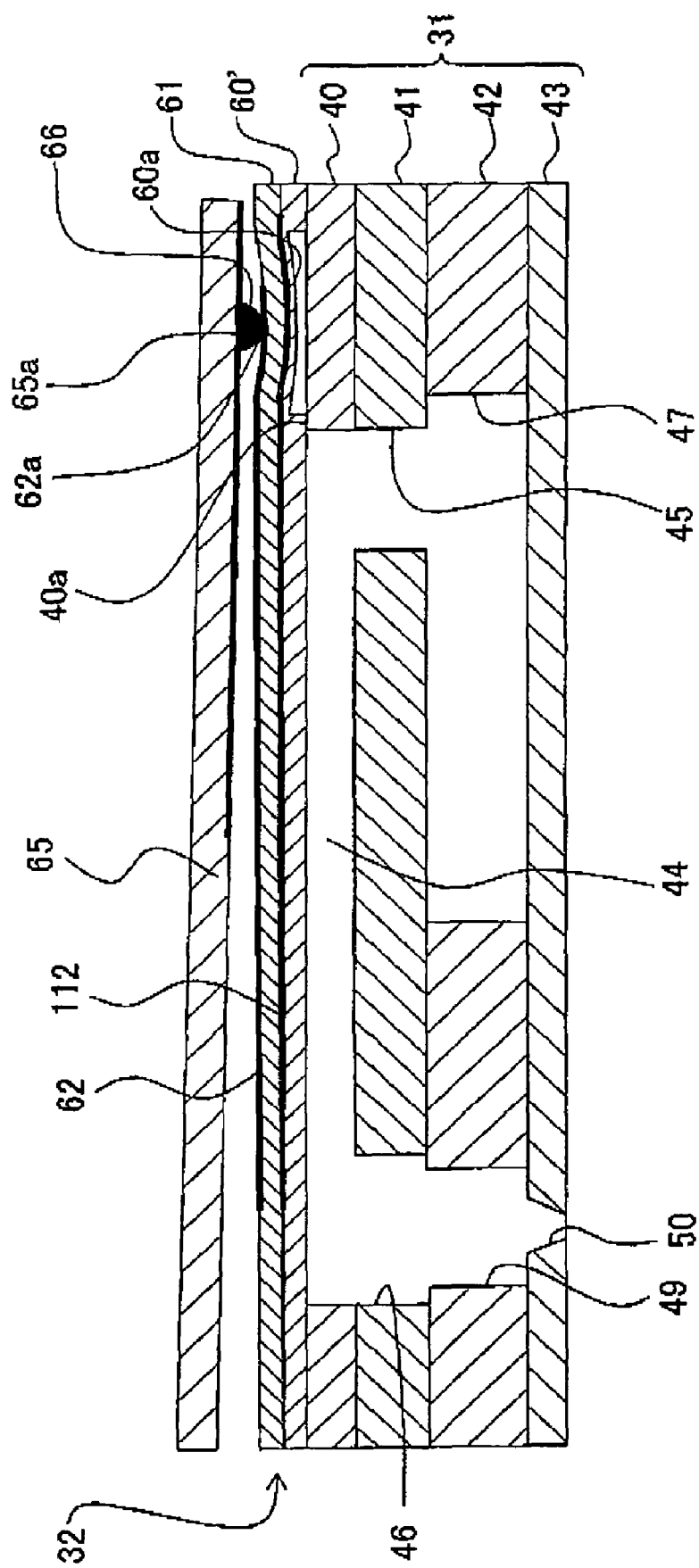
FIG. 15 is a cross-sectional view of an ink-jet head in an eleventh modified embodiment.

In the embodiment and the modified embodiments described above, the vibration plate 60 (74) is formed of an electroconductive metallic material so as to serves also as a common electrode. However, as shown in FIG. 15, as a modified example of FIG. 3, a vibration plate 60' may be formed by an insulating material and a common electrode (first electrode) 112 may be formed on the vibration plate 60'. Or an insulating layer may be provided on the vibration plate 60 (74) and the common electrode (first electrode) may be provided on the insulating layer.

What is claimed is:

1. A piezoelectric actuator comprising:
   a vibration plate;
   a supporting member which includes a relieving section which relieves a deformation of the vibration plate, and a joining section which is joined to the vibration plate;
   a first electrode which is arranged on a surface of the vibration plate on a side opposite to the supporting member;
   a piezoelectric layer which is arranged on a surface of the first electrode on a side opposite to the vibration plate;
   a second electrode which is arranged on a surface of the piezoelectric layer on a side opposite to the vibration plate, in an area facing the relieving section;
   a contact section which is formed on the surface of the piezoelectric layer on the side opposite to the vibration plate, in an area facing the joining section, the contact section being connected to the second electrode; and
   a wire member which supplies a drive voltage to the contact section, wherein:
   an electroconductive bump is formed on one of a terminal section of the wire member and the contact section, the bump being projected toward the other of the terminal section and the contact section to electrically connect the contact section and the terminal section; and
   a reduced-stiffness section is provided between the vibration plate and the supporting member or between the vibration plate and the piezoelectric layer, at a portion facing the bump, the reduced-stiffness section having a stiffness reduced than a stiffness of a portion other than the portion facing the bump.

2. The piezoelectric actuator according to claim 1, wherein the reduced-stiffness section is interposed between the vibration plate and the supporting member and is a low-elasticity material having a lower elasticity than an elasticity of the vibration plate and an elasticity of the supporting member.

3. The piezoelectric actuator according to claim 1, wherein the reduced-stiffness section is a through hole or a recess formed in at least one of the vibration plate and the supporting member, at a portion facing the bump, the recess or the through hole being open toward the other of the vibration plate and the supporting member.

4. The piezoelectric actuator according to claim 3, wherein a low elasticity material having a lower elasticity than an elasticity of the vibration plate and an elasticity of the supporting member is filled in the recess or the hole.

5. The piezoelectric actuator according to claim 1, wherein the supporting member is formed of a metallic material.

6. The piezoelectric actuator according to claim 1, wherein the supporting member is formed of an insulating material or an adhesive.

7. The piezoelectric actuator according to claim 1, wherein the vibration plate is formed of a metallic material, and the vibration plate serves as the first electrode.

8. The piezoelectric actuator according to claim 1, wherein an insulating layer is interposed between the vibration plate and the piezoelectric layer, and at a portion facing the bump.

9. The piezoelectric actuator according to claim 8, wherein the insulating layer is made of an insulating material which has a lower elasticity than an elasticity of both the vibration plate and the piezoelectric layer.

10. The piezoelectric actuator according to claim 1, wherein a length of the reduced-thickness section in a direction of a plane of the piezoelectric layer is not less than four times of a sum of a thickness of the vibration plate and a thickness of the piezoelectric layer.

11. A liquid transporting apparatus comprising:
a liquid channel which includes a nozzle and a pressure chamber communicating with the nozzle; and
a piezoelectric actuator comprising:
a vibration plate;
a supporting member which includes a relieving section which relieves a deformation of the vibration plate, and a joining section which is joined to the vibration plate;
a first electrode which is arranged on a surface of the vibration plate on a side opposite to the supporting member;
a piezoelectric layer which is arranged on a surface of the first electrode on a side opposite to the vibration plate;
a second electrode which is arranged on a surface of the piezoelectric layer on a side opposite to the vibration plate, in an area facing the relieving section;
a contact section which is formed on the surface of the piezoelectric layer on the side opposite to the vibration plate, in an area facing the joining section, the contact section being connected to the second electrode; and
a wire member which supplies a drive voltage to the contact section;
wherein an electroconductive bump is formed on one of a terminal section of the wire member and the contact section, the bump being projected toward the other of the terminal section and the contact section to electrically connect the contact section and the terminal section;
wherein a reduced-stiffness section is provided between the vibration plate and the supporting member or between the vibration plate and the piezoelectric layer, at a portion facing the bump, the reduced-stiffness section having a stiffness reduced than a stiffness of a portion other than the portion facing the bump; and
wherein the relieve section of the piezoelectric actuator corresponds to the pressure chamber.

12. A liquid transporting apparatus according to claim 11, which is an ink-jet printer.

13. A method for manufacturing the piezoelectric actuator as defined in claim 1, the method comprising:
a first step of providing a reduced-stiffness section between the vibration plate and the supporting member, and at a portion facing a portion in which the bump is to be arranged, the reduced-stiffness section having a stiffness reduced than a stiffness of a portion other than the portion facing the bump;
a second step of joining the vibration plate and the supporting member at the joining section;
a third step of forming the piezoelectric layer on the surface of the vibration plate on the side opposite to the supporting member, the first electrode being arranged on the surface;
a fourth step of forming, on the surface of the piezoelectric layer on the side opposite to the vibration plate, the second electrode in an area facing the relieving section and a contact section connected to the second electrode in an area facing the joining section;
a fifth step of forming the bump having electroconductivity on one of the terminal section of the wire member and the contact section, the bump projecting toward the other of the terminal section and the contact section; and
a sixth step of pressing the wire member against the contact section to electrically connect the terminal section of the wire member and the contact section via the bump.

14. The method for manufacturing piezoelectric actuator according to claim 13, wherein in the first step, a recess or a through hole is formed as the reduced-stiffness section in at least one of the vibration plate and the supporting member, at a portion facing the portion where the bump is to be arranged, the recess or the through hole being open toward the other of the vibration plate and the supporting member.

15. The method for manufacturing piezoelectric actuator according to claim 13, wherein in the third step, the piezoelectric layer is formed by an aerosol deposition method or a sputtering method.

16. A liquid transporting apparatus comprising a liquid channel which includes a plurality of pressure chambers arranged along a plane and communicating with nozzles respectively, and a piezoelectric actuator which changes a volume of the pressure chambers to apply pressure to a liquid in the pressure chambers,
wherein the piezoelectric actuator includes:
a pressure chamber plate in which the pressure chambers are formed;
a vibration plate which is joined to one surface of the pressure chamber plate and which covers the pressure chambers;
a common electrode which is arranged on a surface of the vibration plate on a side opposite to the pressure chambers;
a piezoelectric layer which is formed on a surface of the common electrode on a side opposite to the vibration plate;
a plurality of individual electrodes which are arranged on a surface of the piezoelectric layer on a side opposite to the vibration plate, in an area facing the pressure chambers respectively;
a plurality of contact sections which are formed on the surface of the piezoelectric layer on the side opposite to the vibration plate, in an area where the vibration chamber plate and the vibration plate are joined, the contact sections being connected to the individual electrodes respectively; and
a wire member which selectively supplies a drive voltage to the contact sections; wherein:
a plurality of electroconductive bumps are formed on one of the wire member and the respective contact sections, the bumps being projected toward the other of the wire member and the respective contact sections to electrically connect the wire member and the contact sections; and
a plurality of reduced-stiffness sections are formed on at least one of the vibration plate and the pressure chamber plate, at a portion facing the bumps, each of the reduced-stiffness sections having a stiffness reduced than a stiffness of a portion other than the portion facing the bumps.

17. The liquid transporting apparatus according to claim 16, wherein each of the reduced-stiffness sections is a recess or a through hole formed in at least one of the vibration plate and the pressure chamber plate, at a portion facing one of the bumps, the recess or the through hole being open toward other of the vibration plate and the pressure chamber plate.

18. The liquid transporting apparatus according to claim 17, wherein the recess or the through hole is extended at least up to a space between a pressure chamber of the pressure chambers and an adjacent pressure chamber to the pressure chamber.

19. The liquid transporting apparatus according to claim 16, which is an ink-jet printer.

* * * * *